United States Patent
Saito

(10) Patent No.: US 7,102,395 B2
(45) Date of Patent: Sep. 5, 2006

(54) POWER-SUPPLY VOLTAGE DETECTION CIRCUIT AND INTEGRATED CIRCUIT DEVICE

(75) Inventor: Hirofumi Saito, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 21 days.

(21) Appl. No.: 10/879,402

(22) Filed: Jun. 30, 2004

(65) Prior Publication Data

US 2005/0001658 A1 Jan. 6, 2005

(30) Foreign Application Priority Data

Jul. 3, 2003 (JP) ............... 2003-270685

(51) Int. Cl.
*H03K 5/22* (2006.01)
(52) U.S. Cl. .................................. 327/74; 327/541
(58) Field of Classification Search ............ 327/72–75, 327/77, 89, 198, 535, 540, 541, 545, 546
See application file for complete search history.

(56) References Cited

U.S. PATENT DOCUMENTS

| | | | | |
|---|---|---|---|---|
| 4,585,001 A | * | 4/1986 | Belt .............................. | 607/9 |
| 5,414,378 A | * | 5/1995 | Edgar et al. ................. | 327/143 |
| 5,514,972 A | | 5/1996 | DeMoor et al. ............. | 324/678 |
| 5,812,021 A | * | 9/1998 | Ikeda .......................... | 327/541 |
| 5,936,455 A | * | 8/1999 | Kobayashi et al. .......... | 327/437 |
| 6,069,518 A | * | 5/2000 | Nakai et al. ................. | 327/535 |
| 6,914,494 B1 | * | 7/2005 | Chen ........................... | 331/111 |
| 2002/0031032 A1 | * | 3/2002 | Ooishi ......................... | 365/226 |

FOREIGN PATENT DOCUMENTS

| | | |
|---|---|---|
| DE | 199 43 365 A1 | 4/2001 |
| JP | 58-135969 | 8/1983 |
| JP | 10-288634 | 10/1998 |

OTHER PUBLICATIONS

European Search Report dated Mar. 14, 2005.
IEEE Journal of Solid-State Circuit, Jun. 1997, pp. 228-231.
"Analog Electronic Circuit", Nobuo Fujii, Shoukoudou, pp. 162-163.

* cited by examiner

*Primary Examiner*—Terry D. Cunningham
*Assistant Examiner*—Thomas J Hiltunen
(74) *Attorney, Agent, or Firm*—McGinn IP Law Group, PLLC

(57) ABSTRACT

The power-supply voltage detection circuit to detect that an external power-supply voltage and/or an internal power-supply voltage generated from the external power-supply voltage goes out of predetermined regulation comprises a first comparator for detecting the internal power-supply voltage being equal to or less than a predetermined value, a second comparator for detecting the internal power-supply voltage being greater than a predetermined value, a first capacitor for AC-coupling one of the input terminals of the first comparator to the external power-supply voltage, and a second capacitor for AC-coupling one of the input terminals of the second comparator to the external power-supply voltage.

8 Claims, 10 Drawing Sheets

PRIOR ART

POWER-SUPPLY VOLTAGE DETECTION CIRCUIT AND INTEGRATED CIRCUIT DEVICE

BACKGROUND OF THE INVENTION

1. Field of the Invention

This invention relates to integrated circuit devices, in particular, an integrated circuit device with a power-supply voltage detection circuit to detect that a power-supply voltage goes out of predetermined regulation.

2. Description of a Related Art

Recently, there have been an increasing number of integrated "system on chip" that support embedded functions such as CPU, logic gates, memory, and so on, as well as integrated circuits with single function above.

In such an integrated circuit device, different power-supply voltages are needed for each internal circuit; thus, in order to supply each internal circuit, a plurality of regulator circuits are incorporated to generate internal power-supply voltages VDD from an external power-supply voltage EVDD.

Although the regulator circuit is configured to keep the internal power-supply voltage VDD constant by employing a feedback loop, in a case where the external power-supply voltage EVDD varies abruptly, the regulator circuit cannot respond to the variation and the internal power-supply voltage VDD varies accordingly. This causes the problems of runaways of CPU or writing failures on the memory.

In order to deal with this problem, by embedding a voltage detection circuit in the integrated circuit which detects whether the power-supply voltage goes out of regulation, a resetting procedure is usually made on CPU when the external power-supply voltage EVDD or the internal power-supply voltage VDD goes out of regulation.

FIG. 7 shows a circuit diagram of a related art that discloses the arrangement embedding a power-supply voltage detection circuit.

As shown in FIG. 7, the conventional integrated circuit device comprises a reference voltage generator circuit 1 which generates a predetermined reference voltage VREF, a regulator circuit 2 which generates the internal power-supply voltage VDD to be supplied to the internal circuit 4 from the reference voltage VREF, and a power-supply voltage detection circuit 5 which detects whether or not the internal power-supply voltage VDD from the regulator circuit 2 is out of regulation and outputs the results of the detection.

The reference voltage generator circuit 1 generates the constant reference voltage VREF by using a forward voltage of diode D1, which, for example, is described in IEEE JOURNAL OF SOLID-STATE CIRCUIT, JUNE 1977, P. 228–231.

The regulator circuit 2 comprises a differential amplifier circuit 21, a transistor 22 which supplies the internal power-supply voltage VDD to the internal circuit 4 including CPU, and four resistors Ra, Rb, Rc and Rd which divide the internal power-supply voltage VDD. The regulator circuit 2 shown in FIG. 7 is described, for example, in "Analog Electronic Circuit" Nobuo Fujii, Shoukoudou, p.162–163.

The + input terminal of the differential amplifier circuit 21 is fed with the reference voltage VREF. The − input terminal of the differential amplifier circuit 21 is fed back with the output voltage of the node between resistors Rb and Rc. In this case, the internal power-supply voltage VDD can be expressed by the following equation:

$$VDD=((Ra+Rb+Rc+Rd)/(Rc+Rd))VREF$$

This means, in the regulator circuit 2 shown in FIG. 7, the internal power-supply voltage VDD can be adjusted by choosing the ratio of (Ra+Rb) to (Rc+Rd).

The power-supply voltage detection circuit 5 comprises a first comparator 51 which detects the internal power-supply voltage VDD being equal to or less than a predetermined value and a second comparator 52 which detects the internal power-supply voltage being greater than a predetermined value.

The − input terminal of the first comparator 51 is fed with the output voltage VL, where VL is the voltage at the node between resistors Ra and Rb in the regulator circuit 2. The + input terminal of the second comparator 52 is fed with the output voltage VH, where VH is the voltage at the node between resistors Rc and Rd in the regulator circuit 2. The + input terminal of the first comparator 51 and − input terminal of the second comparator 52 are fed with the reference voltage VREF.

VL and VH can be expressed by the following equation:

$$VL=((Rb+Rc+Rd)/(Ra+Rb+Rc+Rd))VDD$$

$$VH=(Rd/(Ra+Rb+Rc+Rd))VDD$$

If the internal power-supply voltage VDD is within regulation, both the outputs of the first comparator 51 and the second comparator 52 result in low level because of the state VREF<VL and VREF>VH.

On the other hand, if the internal power-supply voltage VDD decreases, VL and VH also decrease, and upon reaching VREF>VL, the output of the first comparator 51, OUTL, turns to high level. If the internal power-supply voltage VDD increases, VL and VH also increase, and upon reaching VREF<VH, the output of the second comparator 52, OUTH, turns to high level.

Therefore, according to the arrangement in FIG. 7, when the internal power-supply voltage VDD goes out of regulation, a detection signal indicating this voltage anomaly is generated from the first comparator 51 or the second comparator 52, and this signal prevents CPU runaway by resetting the operation of the internal circuit.

According to the conventional integrated circuit in FIG. 7, however, a sudden variation of the external power-supply voltage EVDD causes the problem that the detection signal (that is, high level) which indicates this voltage anomaly is not generated because the power-supply voltage detection circuit cannot respond to this sudden variation.

FIG. 8 and FIG. 9 show the results of simulations for VDD (the internal power-supply voltage), VREF (the reference voltage), VL (the output voltage of the node between resisters Ra and Rb), VH (the output voltage of the node between resister Rc and Rd), OUTL (the output of the first comparator), and OUTH (the output of the second comparator), where EVDD (the external power-supply voltage) is in a abrupt variation.

As shown in FIG. 8, a sudden decrease of the external power-supply voltage EVDD causes a decrease of the internal power-supply voltage VDD after the duration of response time in the regulator circuit 2. As shown in FIG. 8, for example, when the external power-supply voltage EVDD decreases from 2.7V to 1.7V, the internal power-supply voltage VDD decreases from 2.3V to 2.0V. At this time, while the first comparator 51 should have detected this voltage anomaly of the internal power-supply voltage VDD, the output OUTL remains low level. The condition VDD=2.0V can cause a runaway of CPU; thus, not being able to detect this voltage as abnormal will be a fatal defect for the products.

If the resistances of the resistors Ra, Rb, Rc and Rd are so adjusted that VL is close to the reference voltage VREF when the internal power-supply voltage VDD is in normal state, it will be possible for the first comparator 51 to result in high level when the external power-supply voltage EVDD varies in the way shown in FIG. 8. In this case, however, the detection sensitivity becomes so high that even a noise on the input of the first comparator 51 can cause the output of the first comparator 51, OUTL, to turn to high level. This results in unnecessary resets in the CPU operation.

On the other hand, as shown in FIG. 9, a sudden increase of the external power-supply voltage EVDD does not cause the variation of the internal power-supply voltage VDD, so that neither VL nor VH varies; thus, the output of the second comparator 52, OUTH, remains low level. In this case, the internal power-supply voltage VDD is in constant control so that there is no possibility of a runaway of CPU in the internal circuit 4. If, however, the external power-supply voltage EVDD exceeds the rating for each element such as reference voltage generator circuit 1 or regulator circuit 2, there is a possibility of the integrated circuit being destroyed.

For this problem, an arrangement for detecting sudden variations of the external power-supply voltage EVDD is proposed by, for example, Japanese Unexamined Patent Application Publication No. 10-288634. The arrangement of the power-supply voltage detection circuit described in this conventional art is shown in FIG. 10.

As shown in FIG. 10, a power-supply voltage detection circuit disclosed in the above conventional art comprises four resistors R1, R2, R3, and R4 which divide the external power-supply voltage EVDD, a first comparator 61 which detects a sudden decrease of the external power-supply voltage EVDD, a second comparator 62 which detects a sudden increase of the external power-supply voltage EVDD, an OR gate 63 which outputs the OR output signal of the first comparator 61 and the second comparator 62, and a set of resistor R5 and capacitor Cx which charges and discharges one of the inputs of the first comparator 61 and the second comparator 62.

The − input terminal of the first comparator 61 is fed with the output voltage of the node between resistors R1 and R2 (node A), and the + input terminal of the second comparator 62 is fed with the output voltage of the node between resistors R3 and R4 (node B). The + input terminal of the first comparator 61 and − input terminal of the comparator 62 (node C) are grounded via capacitor Cx, and are fed with the output voltage of the node between resistors R2 and R3 via resistor R5.

In the power-supply voltage detection circuit of this arrangement shown in FIG. 10, setting R3>R5 results in $V_A>V_C>V_B$, where $V_A$, $V_B$ and $V_C$ represent the output voltages for normal state at node A, B and C respectively. In this state, both the outputs of the first comparator 61 and the second comparator 62 are low level.

If the external power-supply voltage EVDD suddenly decreases from the state above, the output voltage $V_A$ at node A abruptly varies in response to the decrease, and the output voltage $V_C$ at node C decreases with the time-constant defined by the capacitor Cx and resistor R5, resulting in an inversion of the relation between $V_A$ at node A and $V_C$ at node C. This inversion allows the first comparator 61 to output high level.

Also, if the external power-supply voltage EVDD suddenly increases, the output voltage $V_B$ at node B abruptly varies in response to the increase, and the output voltage $V_C$ at node C increases with the time-constant defined by the capacitor Cx and resistor R5, resulting in an inversion of the relation between $V_B$ at node B and $V_C$ at node C. This inversion allows the second comparator 62 to output high level.

If the power-supply voltage varies gradually, the relations among output voltages $V_A$, $V_B$ and $V_C$ at nodes A, B and C do not vary; thus, both the outputs of the first comparator 61 and the second comparator 62 remain low level.

As mentioned above, in the conventional power-supply voltage detection circuit shown in FIG. 7, there is a problem that sudden variations of the external power-supply voltage EVDD cannot be detected. Further, there will be another problem that if the detection sensitivity is raised in order to detect sudden variations of the external power-supply voltage EVDD, the detector will unnecessarily respond to noises and wrongly output detection signals indicating voltage anomalies, resulting in unnecessary resets in the CPU operation.

On the other hand, although the power-supply voltage detection circuit in FIG. 10 can detect sudden variations of the power-supply voltage, if the power-supply voltage varies gradually, voltage anomalies cannot be detected.

While, by combining the circuits of FIG. 7 and FIG. 10, it is possible to achieve the power-supply voltage detection circuit capable of detecting sudden and gradual variations of the power-supply voltage, the size of such a circuit would be larger, resulting in other problems of larger footprint and higher price of the chip.

SUMMARY OF THE INVENTION

In view of the foregoing, it is an object of the present invention to provide a power-supply voltage detection circuit which is able to detect both sudden and gradual variations of the power-supply voltage with a minimum expansion of the circuit in size, and an integrated circuit device incorporating a power-supply voltage detection circuit above.

To these ends, according to one aspect of the present invention, there is provided a power-supply voltage detection circuit for detecting that an external power-supply voltage and/or an internal power-supply voltage generated from the external power-supply voltage goes out of predetermined regulation, comprising a first comparator for detecting the internal power-supply voltage being equal to or less than a predetermined value, a second comparator for detecting the internal power-supply voltage being greater than a predetermined value, a first capacitor for AC-coupling one input terminal of the first comparator to the external power-supply voltage, and a second capacitor for AC-coupling one input terminal of the second comparator to the external power-supply voltage.

The above power-supply voltage detection circuit may further comprises a third capacitor for AC-coupling one input terminal of the first comparator to the internal power-supply voltage, and a forth comparator for AC-coupling one input terminal of the second comparator to the internal power-supply voltage. Further, the above power-supply voltage detection circuit may comprise a fifth capacitor for AC-coupling one input terminal of the first comparator to a ground, and a sixth capacitor for AC-coupling one input terminal of the second comparator to the ground.

According to still another aspect of the present invention, there is provided a power-supply voltage detection circuit for detecting that an external power-supply voltage and/or an internal power-supply voltage generated from the external power-supply voltage goes out of predetermined regulation, comprising a first comparator for comparing a signal voltage inputted to a first terminal of the first comparator, which corresponds to the internal power-supply voltage, with a predetermined voltage inputted to a second terminal of the first comparator, a second comparator for comparing a signal voltage inputted to a first terminal of the second comparator, which corresponds to the internal power-supply voltage, with a predetermined voltage inputted to a second terminal of the second comparator, a first capacitor inserted between the first terminal of the first comparator and the external power-supply voltage, and a second capacitor inserted between the first terminal of the second comparator and the external power-supply voltage.

According to yet another aspect of the present invention, there is provided a power-supply voltage detection circuit for detecting anomaly of a power-supply voltage, comprising a comparator for detecting an internal power-supply voltage being equal to or less than a predetermined value, and a capacitor for AC-coupling one input terminal of the comparator to an external power-supply voltage.

According to another aspect of the present invention, there is provided an integrated circuit device, comprising a reference voltage generator circuit for generating a predetermined reference voltage, a regulator circuit for generating the internal power-supply voltage to be supplied to an internal circuit from the external power-supply voltage by using the reference voltage, and the power-supply voltage detection circuit of one of the above.

In the power-supply voltage detection circuit and an integrated circuit configured in such a way above, one of the input terminals of the first comparator is AC-coupled to the external power-supply voltage via the first capacitor, and one of the input terminals of the second comparator is AC-coupled to the external power-supply voltage via the second capacitor, so that if a sudden decrease occurs on the external power-supply voltage, both the voltages of one of the input terminals of the first comparator and that of the second comparator decrease. Likewise, if a sudden increase occurs on the external power-supply voltage, both the voltages of one of the input terminals of the first comparator and that of the second comparator increase.

Therefore, the power-supply voltage detection circuit capable of detecting either sudden or gradual variations of the power-supply voltage is achieved. Furthermore, adding only a few additional capacitors to the conventional arrangement allows the detection of both sudden and gradual variations; thus, the expansion of the circuit is reduced to a minimum.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

The present invention is explained below with reference to the drawings.

Embodiment 1

Figure 1:
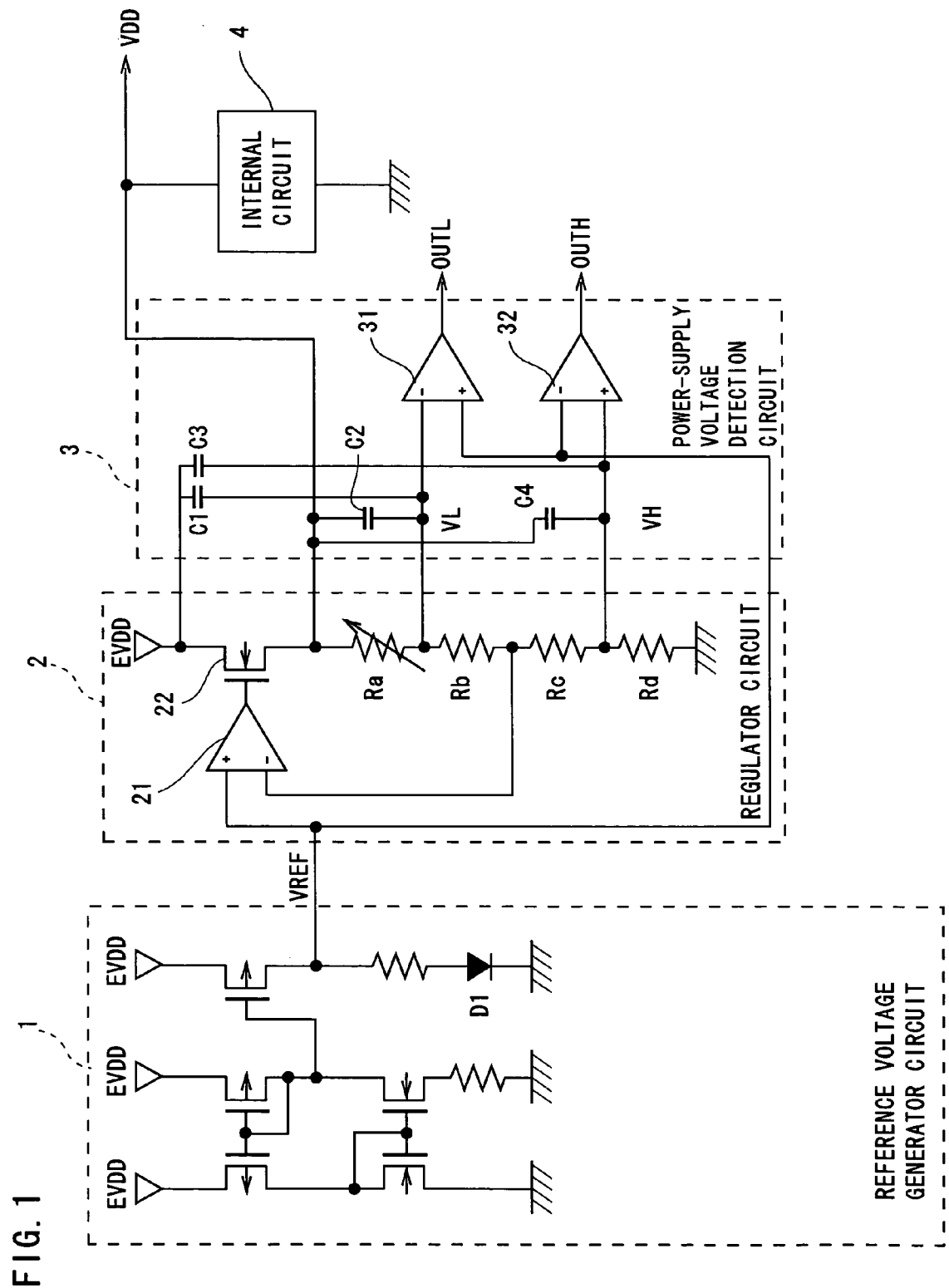
FIG. 1 shows a circuit diagram of an integrated circuit device of the first embodiment.

FIG. 1 shows a circuit diagram of the integrated circuit of the first embodiment in this invention.

Figure 7:
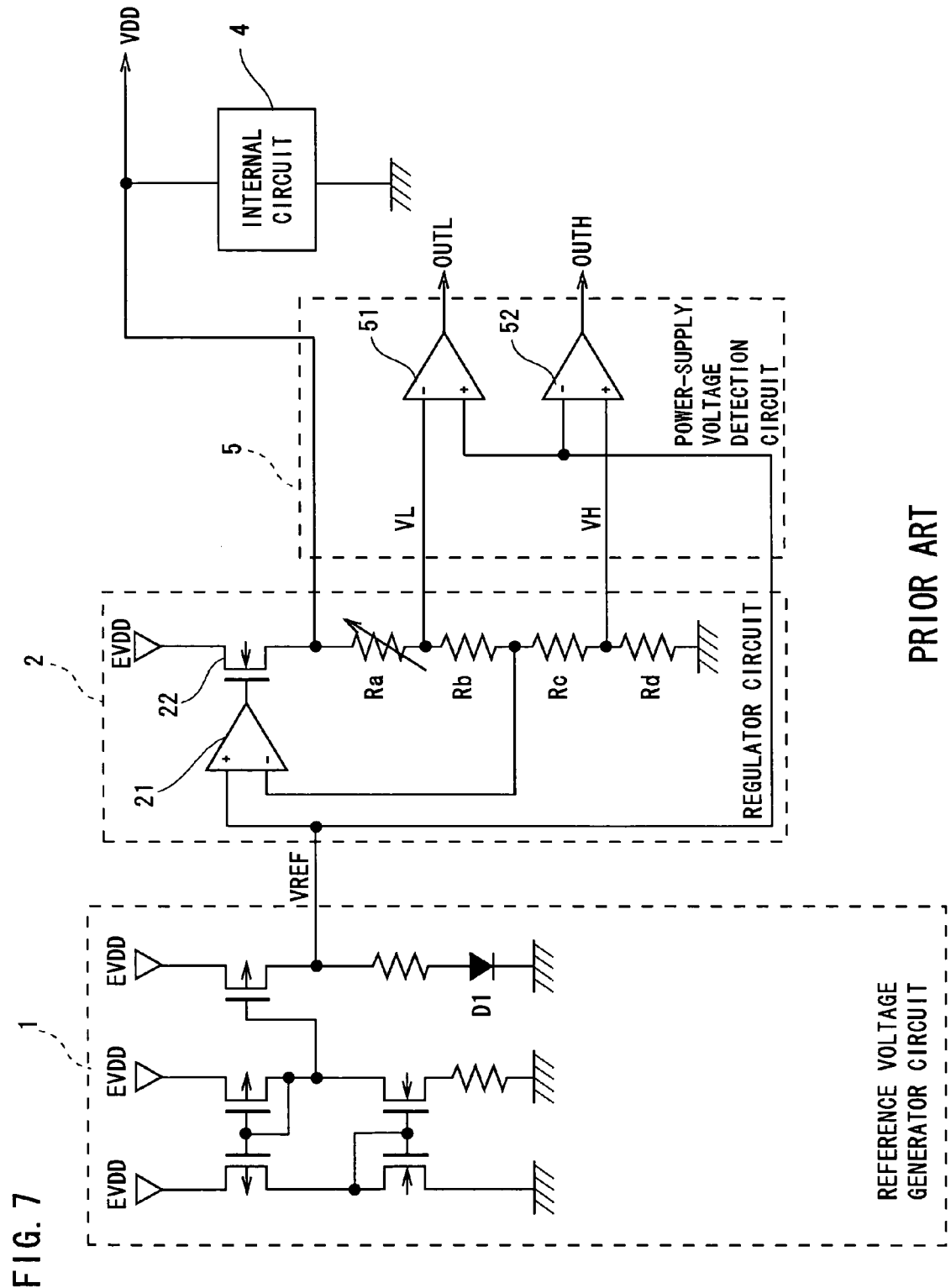
FIG. 7 shows a circuit diagram of a conventional integrated circuit device.
Figure 8:
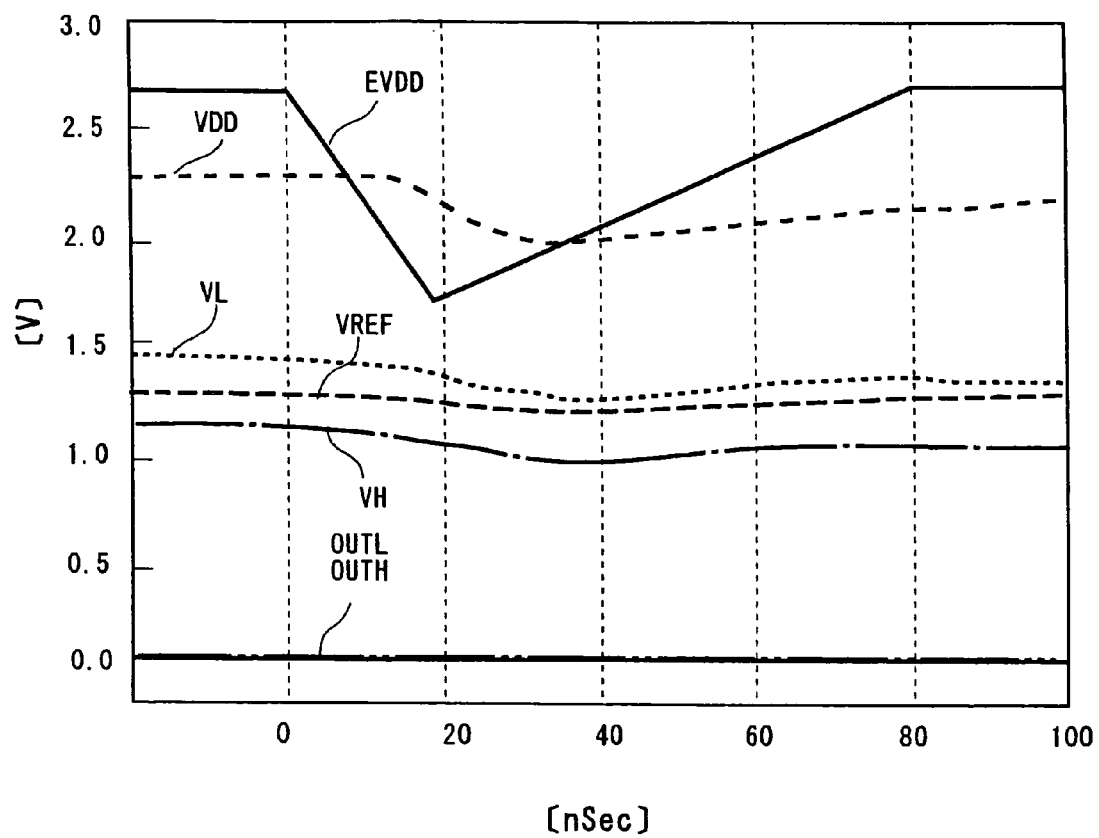
FIG. 8 is a timing chart showing the operation of the power-supply voltage detection circuit when a sudden decrease occurs at the external power-supply voltage in FIG. 7.
Figure 9:
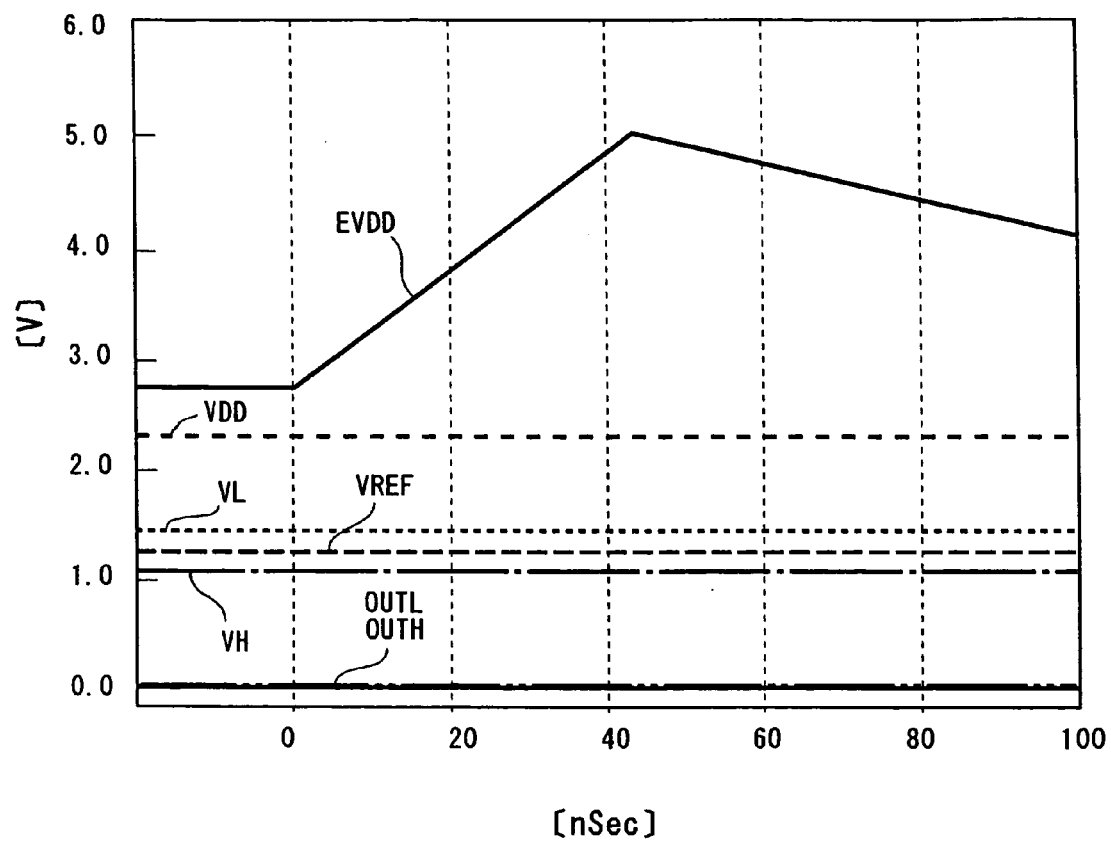
FIG. 9 is a timing chart showing the operation of the power-supply voltage detection circuit when a sudden increase occurs at the external power-supply voltage in FIG. 7.

As shown in FIG. 1, the integrated circuit in the first embodiment as well as the conventional integrated circuit in FIG. 7, has an arrangement which comprises a reference voltage generator circuit 1 which generates a predetermined reference voltage VREF, a regulator circuit 2 which supplies an internal circuit 4 with the internal power-supply voltage VDD from the reference voltage VREF, and a power-supply voltage detection circuit 3 which detects whether or not the internal power-supply voltage VDD from the regulator circuit 2 is out of regulation and outputs the result of the detection.

The power-supply voltage detection circuit 3 of the first embodiment comprises a first comparator 31 which detects the internal power-supply voltage VDD being equal to or less than a predetermined value, a second comparator 32 which detects the internal power-supply voltage VDD being greater than a predetermined value, and capacitors C1 to C4 which detect sudden increases of the external power-supply voltage EVDD.

The − input terminal of the first comparator 31 is fed with an output voltage VL, where VL is the voltage at the node between resistors Ra and Rb in the regulator circuit 2. The + input terminal of the second comparator 32 is fed with an output voltage VH, where VH is the voltage at the node between resistors Rc and Rd in regulator circuit 2. The + input terminal of the first comparator 31 and − input terminal of the second comparator 32 are fed with the reference voltage VREF.

The capacitor C1 is inserted between the external power-supply voltage EVDD and the − input terminal of the first comparator 31, and the capacitor C2 is inserted between the internal power-supply voltage VDD and the − input terminal of the first comparator 31. The capacitor C3 is inserted between the external power-supply voltage EVDD and the + input terminal of the second comparator 32, and the capacitor C4 is inserted between the internal power-supply voltage VDD and the + input terminal of the second comparator 32.

A parasitic capacitor Ca, which is not shown, exists between the − input terminal of the first comparator 31 and the ground, a parasitic capacitor Cb, which is not shown, exists between the + input terminal of the first comparator 31 and the ground, a parasitic capacitor Cc, which is not shown, exists between the − input terminal of the second comparator 32 and the ground, and a parasitic capacitor Cd, which is not shown, exists between the + input terminal of the second comparator 32 and the ground.

The arrangements of the reference voltage generator circuit 1 and the regulator circuit 2 are not explained here because they have the same arrangement as the conventional art in FIG. 7. The arrangements of reference voltage generator circuit 1 and regulator circuit 2, however, are not limited in their arrangement by FIG. 1. Any circuit can be adaptable as reference voltage generator circuit 1 as long as being configured to generate a reference voltage VREF from the external power-supply voltage EVDD. Also, any circuit can be adaptable as regulator circuit 2 as long as being configured to generate an internal power-supply voltage VDD from reference voltage VREF.

In the arrangement above, in the power-supply voltage detection circuit 3 of this embodiment, the − input terminal of the first comparator 31 is AC-coupled to the external power-supply voltage EVDD and to the internal power-supply voltage VDD by capacitors C1 and C2 respectively, and the + input terminal of the second comparator 32 is AC-coupled to the external power-supply voltage EVDD and to the internal power-supply voltage VDD by capacitors C3 and C4 respectively.

Figure 2:
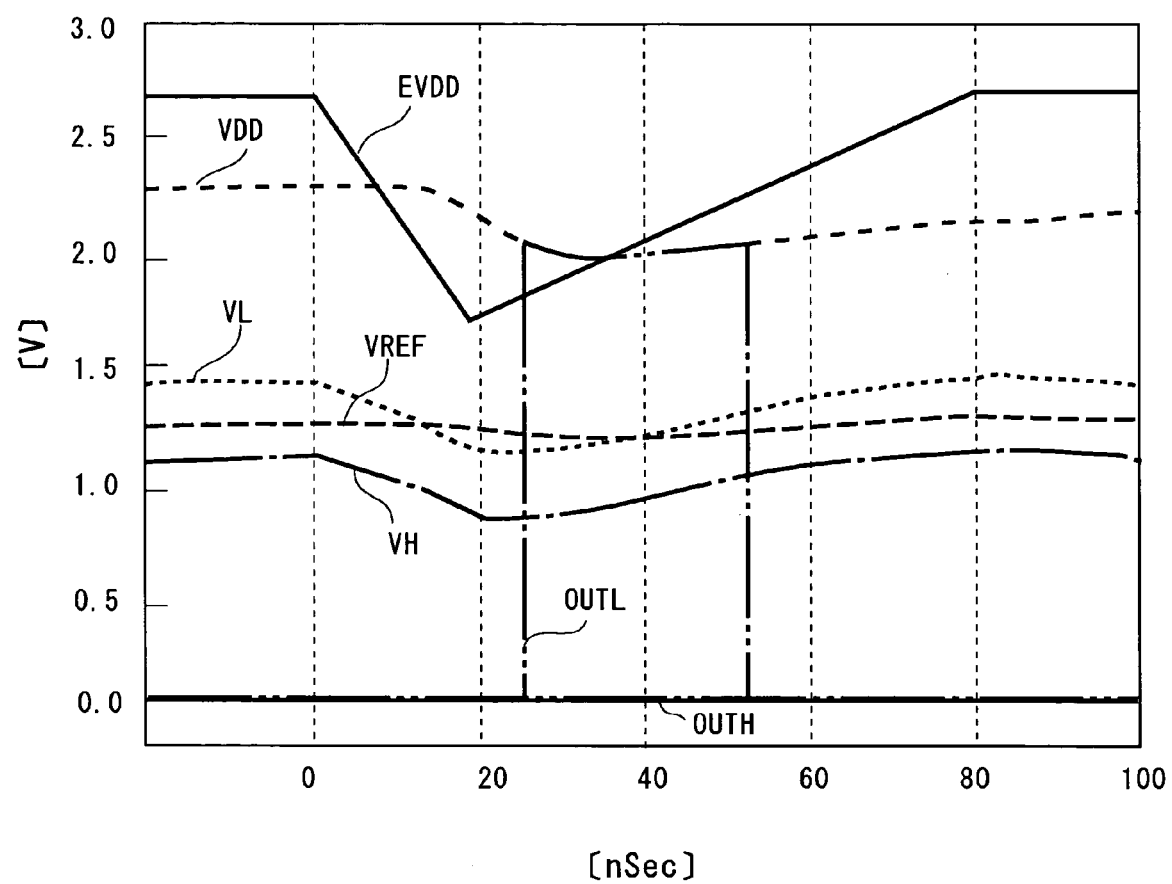
FIG. 2 is a timing chart showing the operation of the power-supply voltage detection circuit when a sudden decrease occurs at the external power-supply voltage in FIG. 1.

Therefore, as shown in FIG. 2, if the external power-supply voltage EVDD suddenly decreases, the voltage at the − input terminal of the first comparator 31, VL, and the voltage at the + input terminal of the second comparator 32, VH, decrease accordingly. Then, upon reaching VREF>VL, the output of the first comparator 31, OUTL, turns to high level.

Figure 3:
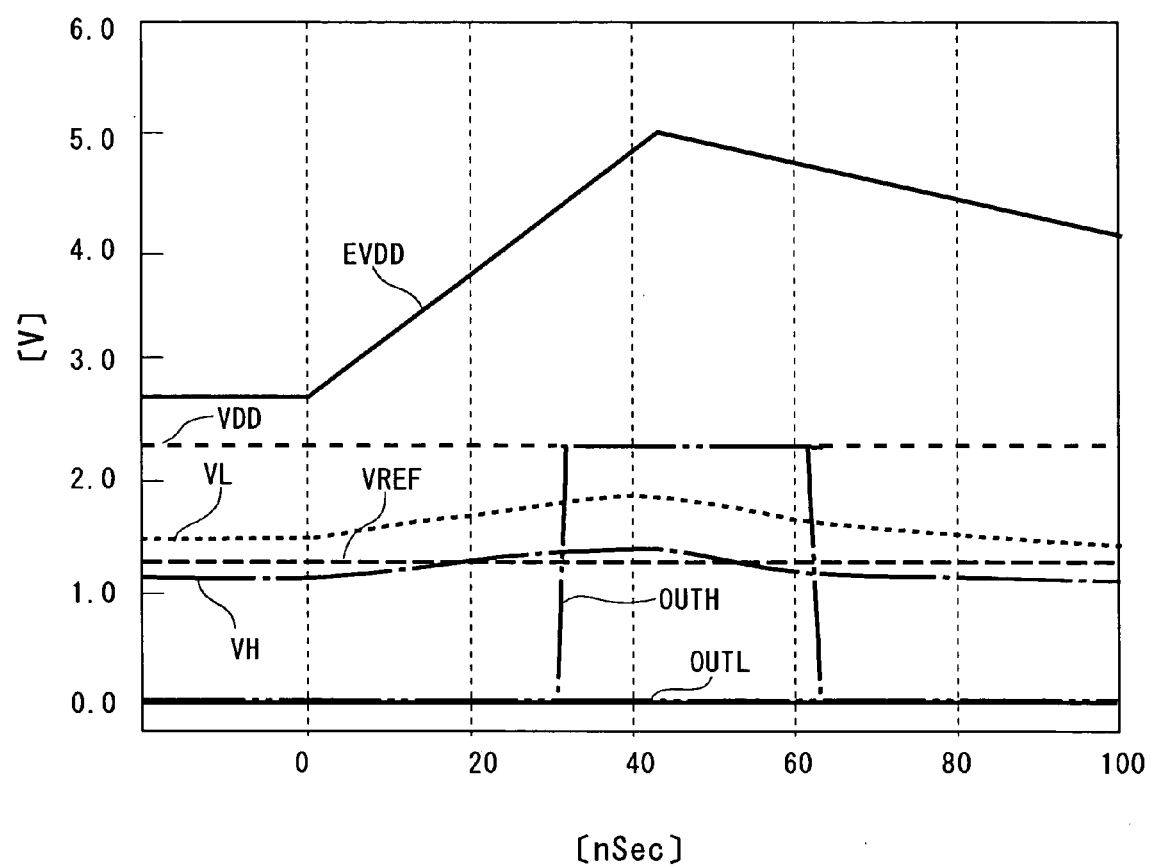
FIG. 3 is a timing chart showing the operation of the power-supply voltage detection circuit when a sudden increase occurs at the external power-supply voltage in FIG. 1.

On the other hand, as shown in FIG. 3, if the external power-supply voltage EVDD suddenly increases, the voltage at the − input terminal of the first comparator 31, VL, and the voltage at the + input terminal of the second comparator 32, VH, increase accordingly. Then, upon reaching VREF<VH, the output of the second comparator 32, OUTH, turns to high level.

In this embodiment, ΔComp1 and ΔComp2 can be expressed by the following equation, where ΔComp1 represents the voltage variation amount at the − input terminal of the first comparator 31 responding to the variation amount of the external power-supply voltage ΔEVDD, and ΔComp2 represents the voltage variation amount at the + input terminal of the second comparator 32 responding to the variation amount of the external power-supply voltage ΔEVDD.

$$\Delta Comp1=(C1/(C1+C2+Ca))\Delta EVDD$$

$$\Delta Comp2=(C3/(C3+C4+Cd))\Delta EVDD$$

For example, in a case where the duration of the variation in which the voltage anomaly should be detected is about several tens of nanoseconds, Ca appears Ca=0.1 pF, and C1 and C2 are set to C1=0.3 pF and C2=0.1 pF, if ΔEVDD is given as ΔEVDD=−1.0V, ΔComp1 results in ΔComp1=−0.2V.

Therefore, the range for variation amount ΔEVDD of the external power-supply voltage which is determined as abnormal, in other words, the sensitivity for the voltage anomaly of the first comparator 31, can be set to any value by adjusting the capacitance ratio of capacitor C1 to C2. Likewise, the sensitivity for the voltage anomaly of the second comparator 32 can be set to any value by adjusting the capacitance ratio of capacitor C3 to C4.

Also, in such an arrangement, the sensitivity for the voltage anomaly which is adjusted by the resistance of resistors Ra, Rb, Rc and Rd in the regulator circuit 2 can be preset at a low value, which prevents the first comparator 31 and second comparator 32 from excessively responding to noises. This can avoid an unnecessary reset of the CPU operation caused by frequent misled detection signals for wrongly detected voltage anomalies.

Furthermore, in a case where the variation of the external power-supply voltage EVDD causes a gradual variation of the internal power-supply voltage VDD, the power-supply voltage detection circuit 3 of this embodiment operates in the same manner as the conventional power-suply voltage detection circuit shown in FIG. 7, and if the internal power-supply voltage VDD decreases, VL and VH also decrease, and upon reaching VREF>VL, the output of the first comparator 31, OUTL, results in high level. If the internal power-supply voltage VDD increases, VL and VH also increase, and upon reaching VREF<VH, the output of the second comparator 32, OUTH, results in high level.

Figure 10:
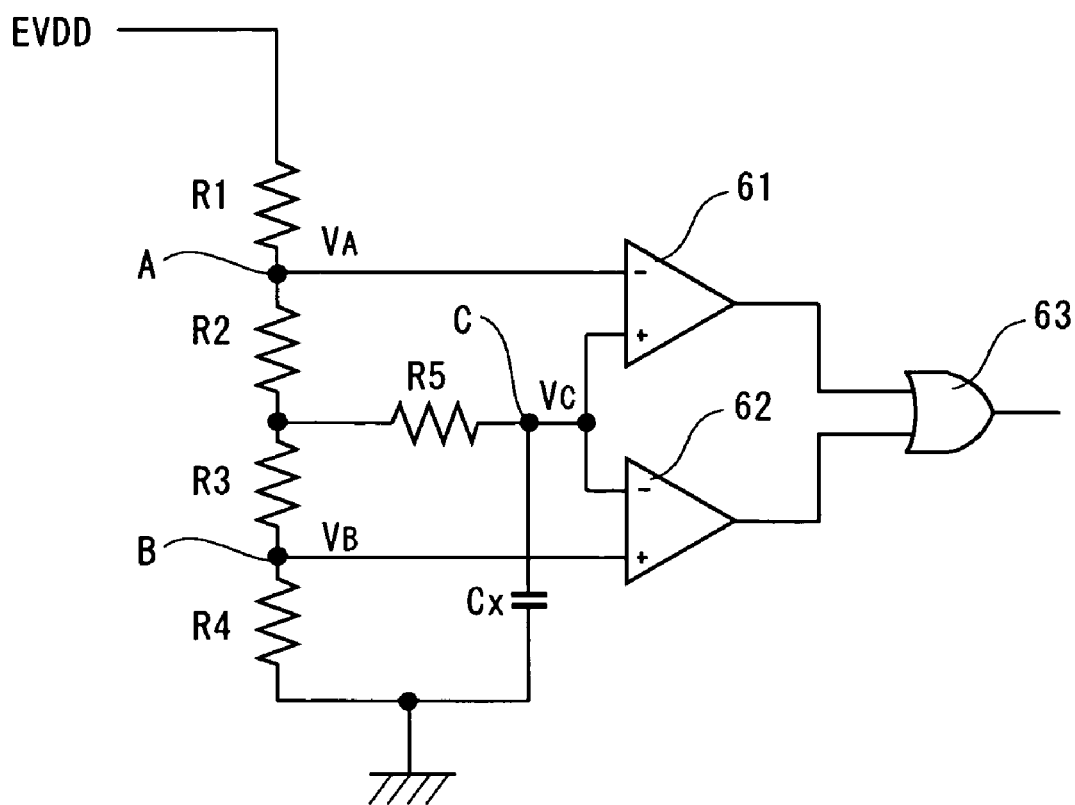
FIG. 10 shows a circuit diagram of a conventional power-supply voltage detection circuit.

Therefore, according to this embodiment, the power-supply voltage detection circuit capable of detecting both the sudden and gradual variations of the power-supply voltage can be achieved. Furthermore, in order to detect a sudden variation of the power-supply voltage, the power-supply voltage detection circuit in this embodiment can be configured by only adding several capacitors, so that there is no need for adding another circuit such as the circuit shown in FIG. 10, and thus, the expansion of the circuit is reduced to a minimum.

Figure 4A:
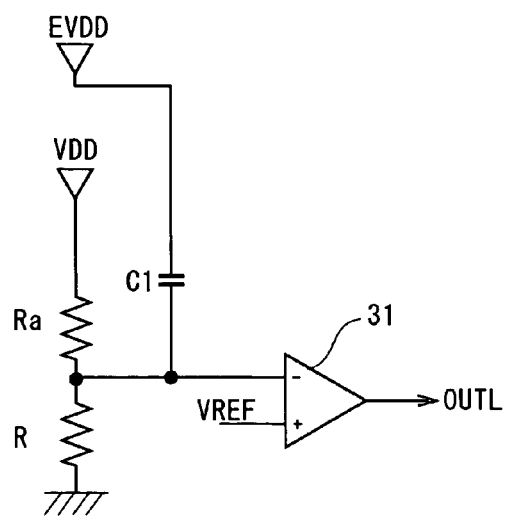
FIG. 4A to 4C show circuit diagrams for altered arrangements of the power-supply voltage detection circuit in FIG. 1.
Figure 4B:
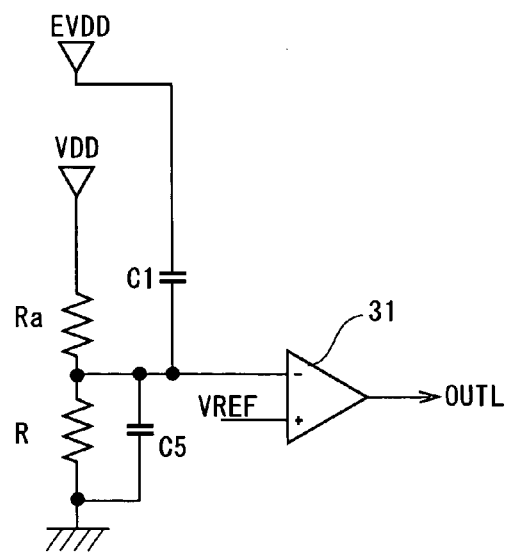
Figure 4C:
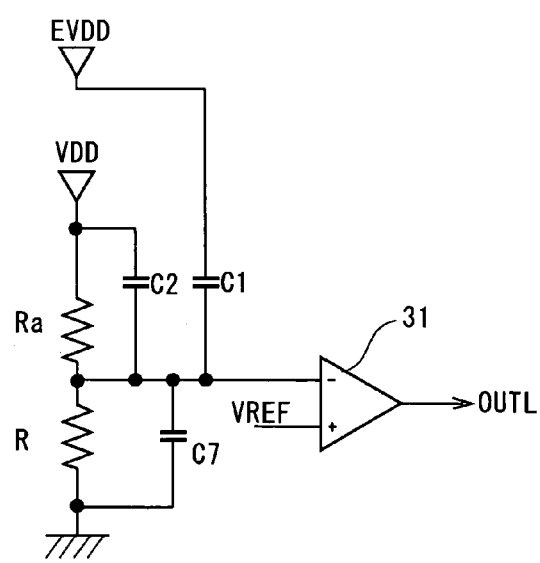

The power-supply voltage detection circuit 3 of this embodiment can be altered as shown in FIG. 4A to 4C to have the same advantages as the circuit shown in FIG. 1. In FIG. 4A to 4C, for clarifying the difference from the circuit in FIG. 1, the set of resistors Rb, Rc and Rd is expressed as one resistor R in the regulator circuit 2. Also, in FIG. 4A to 4C, the peripheral arrangement of the second comparator 32 is omitted. The arrangement related to second comparator 32 will be led by altering the arrangement on the second comparator 32 from FIG. 1 in the same way as the case of the first comparator 31 from FIG. 1 to FIG. 4A to 4C.

The circuit shown in FIG. 4A is configured by removing the capacitor C2 (C4) from power-supply voltage detection circuit 3 of the embodiment in FIG. 1. In this case, ΔComp1 and ΔComp2 can be expressed by the following equation, where ΔComp1 represents the voltage variation amount at the − input terminal of the first comparator 31 responding to the variation amount of the external power-supply voltage ΔEVDD, and ΔComp2 represents the voltage variation amount at the + input terminal of the second comparator 32 responding to the variation amount of the external power-supply voltage ΔEVDD.

$$\Delta Comp1=(C1/(C1+Ca))\Delta EVDD$$

$$\Delta Comp2=(C3/(C3+Cd))\Delta EVDD$$

The circuit shown in FIG. 4B is configured by removing the capacitor C2 (C4) from power-supply voltage detection circuit 3 of the embodiment in FIG. 1, adding a capacitor C5 between the − input terminal of the first comparator 31 and the ground, and adding a capacitor C6 (not shown) between the + input terminal of the second comparator 32 and the ground. In this case, ΔComp1 and ΔComp2 can be expressed by the following equation, where ΔComp1 and ΔComp2 represent the voltage variation amount at the − input terminal of the first comparator 31 and the + input terminal of the second comparator 32 respectively responding to the variation amount of the external power-supply voltage ΔEVDD.

$$\Delta Comp1 = (C1/(C1+C5+Ca))\Delta EVDD$$

$$\Delta Comp2 = (C3/(C3+C6+Cd))\Delta EVDD$$

The circuit shown in FIG. 4C is configured by adding a capacitor C7 between the − input terminal of the first comparator 31 and the ground, and adding a capacitor C8 (not shown) between the + input terminal of the second comparator 32 and the ground to the power-supply voltage detection circuit 3 of the embodiment in FIG. 1. In this case, ΔComp1 and ΔComp2 can be expressed by the following equation, where ΔComp1 and ΔComp2 represent the voltage variation amount at the − input terminal of the first comparator 31 and the + input terminal of the second comparator 32 respectively responding to the variation amount of the external power-supply voltage ΔEVDD.

$$\Delta Comp1 = (C1/(C1+C2+C7+Ca))\Delta EVDD$$

$$\Delta Comp2 = (C3/(C3+C4+C8+Cd))\Delta EVDD$$

EMBODIMENT 2

Figure 5:
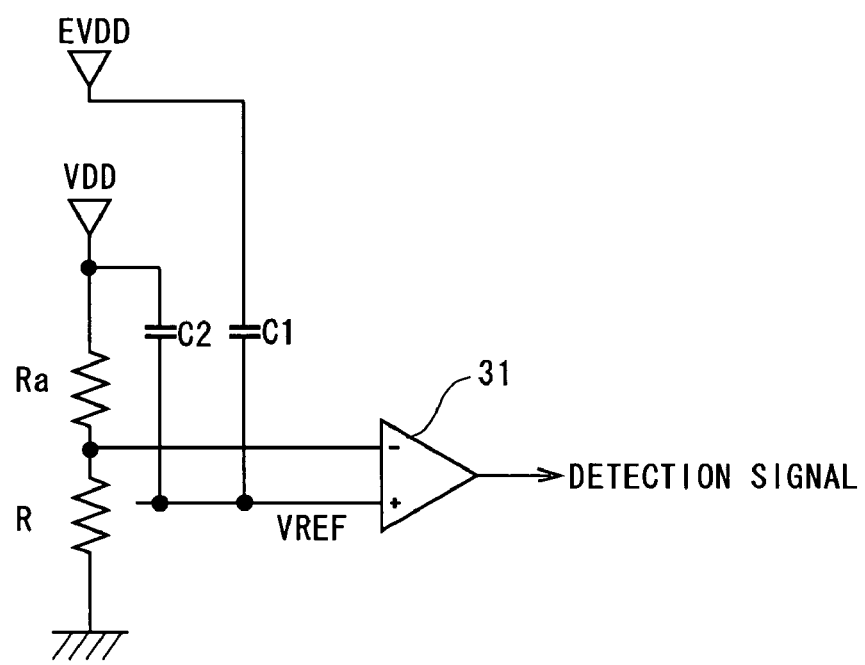
FIG. 5 shows a circuit diagram of an integrated circuit device of the second embodiment.

FIG. 5 shows a circuit diagram of the integrated circuit of the second embodiment in this invention.

As shown in FIG. 5, in a power-supply voltage detection circuit of the second embodiment, a capacitor C1 is inserted between the + input terminal of the first comparator 31, which is fed with the reference voltage VREF, and the external power-supply voltage EVDD. A capacitor C2 is inserted between the + input terminal of the first comparator 31, which is fed with the reference voltage VREF, and the internal power-supply voltage VDD. Likewise, a capacitor C3 is inserted between the − input terminal of the second comparator 32, which is fed with the reference voltage VREF, and the external power-supply voltage EVDD. A capacitor C4 is inserted between the − input terminal of the second comparator 32, which is fed with the reference voltage VREF, and the internal power-supply voltage VDD.

In FIG. 5, in order to clarify the difference from the first embodiment, the set of resistors Rb, Rc and Rd is expressed as one resistor R in the regulator circuit 2. Also, in FIG. 5, the arrangement related to second comparator 32 is omitted. The arrangements of the reference voltage generator circuit and the regulator circuit are the same as that of the first embodiment; thus, they are not explained here.

In the power-supply voltage detection circuit of this embodiment, the + input terminal of the first comparator 31, which is fed with the reference voltage VREF, is AC-coupled to the external power-supply voltage EVDD and to the internal power-supply voltage VDD via capacitor C1 and C2 respectively. The − input terminal of the second comparator 32, which is fed with the reference voltage VREF, is AC-coupled to the external power-supply voltage EVDD and to the internal power-supply voltage VDD via capacitor C3 and C4 respectively.

According to the power-supply voltage detection circuit of this embodiment, if the external power-supply voltage EVDD decreases abruptly, the reference voltage VREF which is fed to both the + input terminal of the first comparator 31 and the − input terminal of the second comparator 32 decreases, and upon reaching VREF<VH, the output of the second comparator 32, OUTH, turns to high level.

On the other hand, if the external power-supply voltage EVDD increases abruptly, the reference voltage VREF which is fed to both the + input terminal of the first comparator 31 and the − input terminal of the second comparator 32 increases, and upon reaching VREF>VL; the output of the first comparator 31, OUTL, turns to high level.

In this case, ΔComp1 and ΔComp2 can be expressed by the following equation, where ΔComp1 represents the voltage variation amount at the + input terminal of the first comparator 31 responding to the variation amount of the external power-supply voltage ΔEVDD, and ΔComp2 represents the voltage variation amount at the − input terminal of the second comparator 32 responding to the variation amount of the external power-supply voltage ΔEVDD.

$$\Delta Comp1 = (C1/(C1+C2+Ca))\Delta EVDD$$

$$\Delta Comp2 = (C3/(C3+C4+Cd))\Delta EVDD$$

In the power-supply voltage detection circuit of this embodiment, contrary to that of the first embodiment, if the external power-supply voltage EVDD decreases abruptly, the detection signal indicating the voltage anomaly is outputted from the second comparator 32, while if the external power-supply voltage EVDD increases abruptly, the detection signal indicating the voltage anomaly is outputted from the first comparator 31.

In a case where the internal power-supply voltage VDD varies gradually, similarly to the case of the first embodiment, if the internal power-supply voltage VDD decreases, the detection signal indicating the voltage anomaly is outputted from the first comparator 31, while if the internal power-supply voltage VDD increases, the detection signal indicating the voltage anomaly is outputted from the second comparator 32.

Therefore, also in this embodiment as well as in the first embodiment, the power-supply voltage detection circuit which is able to detect both sudden and gradual variations of the power-supply voltage is achieved. Furthermore, only several additional capacitors are needed for detecting both sudden and gradual variations, so that there is no need for adding another circuit such as the circuit shown in FIG. 10, and thus, the expansion of the circuit is reduced to a minimum.

Figure 6A:
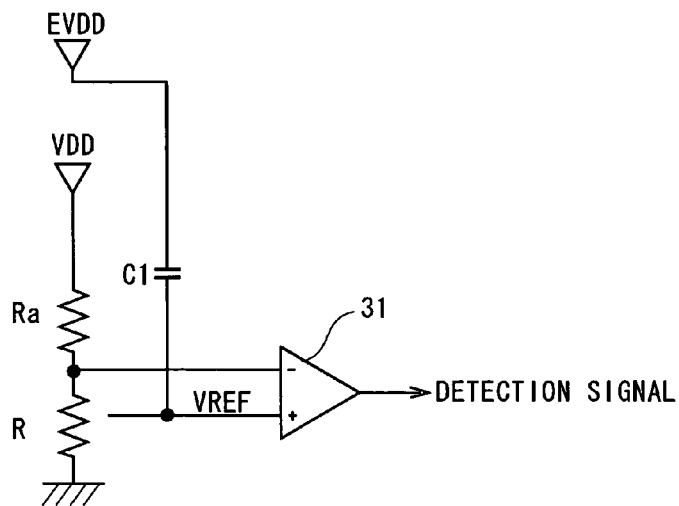
FIG. 6A to 6C show circuit diagrams for altered arrangements of the power-supply voltage detection circuit in FIG. 5.
Figure 6B:
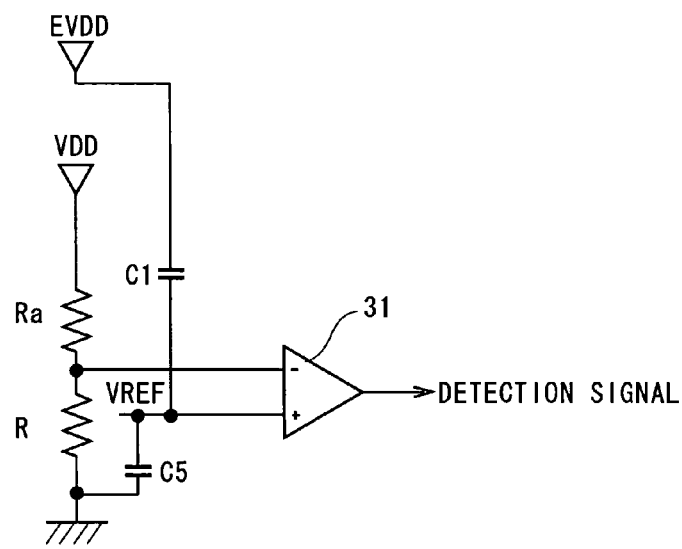
Figure 6C:
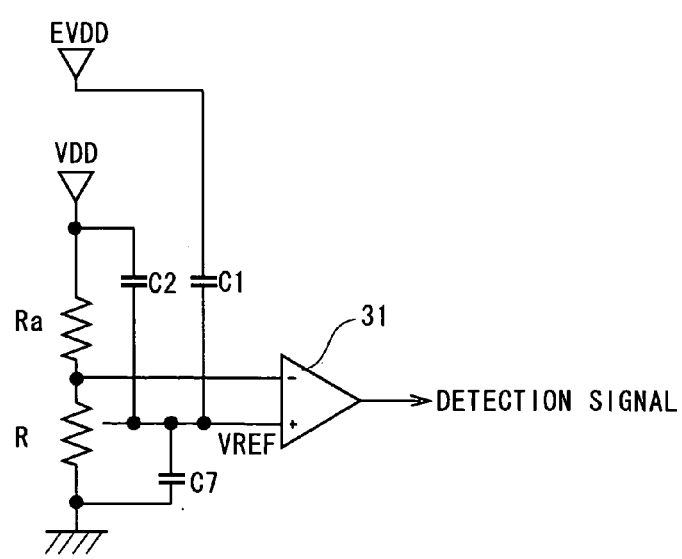

The power-supply voltage detection circuit in this embodiment, as well as that in the first embodiment, can be altered to achieve the same advantages as the circuit shown in FIG. 5 with the altered arrangements shown in FIG. 6A to 6C. In FIG. 6A to 6C, the set of resistors Rb, Rc and Rd is expressed as one resistor R in the regulator circuit 2. In FIG. 6A to 6C, the arrangement related to the second comparator 32 is omitted. The arrangement related to the second comparator 32 will be obtained by the same alteration as the case of the first comparator 31 in FIG. 1.

The circuit shown in FIG. 6A is configured by removing the capacitor C2 (C4) from the power-supply voltage detection circuit 3 of the embodiment in FIG. 5. In this case, ΔComp1 and ΔComp2 can be expressed by the following equation, where ΔComp1 represents the voltage variation amount at the − input terminal of the first comparator 31 responding to the variation amount of the external power-supply voltage ΔEVDD, and ΔComp2 represents the voltage variation amount at the + input terminal of the second comparator 32 responding to the variation amount of the external power-supply voltage ΔEVDD.

$$\Delta Comp1=(C1/(C5+Ca))\Delta EVDD$$

$$\Delta Comp2=(C3/(C6+Cd))\Delta EVDD$$

The circuit shown in FIG. 6B is configured by removing the capacitor C2 (C4) from the power-supply voltage detection circuit 3 of the embodiment in FIG. 5, adding a capacitor C5 between the + input terminal of the first comparator 31 and the ground, and adding a capacitor C6 (not shown) between the − input terminal of the second comparator 32 and the ground. In this case, ΔComp1 and ΔComp2 can be expressed by the following equation, where ΔComp1 and ΔComp2 are the voltage variation amount at the + input terminal of the first comparator 31 and the − input terminal of the second comparator 32 respectively responding to the variation amount of the external power-supply voltage ΔEVDD.

$$\Delta Comp1=(C1/(C1+C5+Ca))\Delta EVDD$$

$$\Delta Comp2=(C3/(C3+C6+Cd))\Delta EVDD$$

The circuit shown in FIG. 6C is configured by adding a capacitor C7 between the + input terminal of the first comparator 31 and the ground, and adding a capacitor C8 (not shown) between the − input terminal of the second comparator 32 and the ground, to the power-supply voltage detection circuit 3 of the embodiment in FIG. 5. In this case, ΔComp1 and ΔComp2 can be expressed by the following equation, where ΔComp1 and ΔComp2 are the voltage variation amount at the + input terminal of the first comparator 31 and the − input terminal of the second comparator 32 respectively responding to the variation amount of the external power-supply voltage ΔEVDD.

$$\Delta Comp1=(C1/(C1+C2+C7+Ca))\Delta EVDD$$

$$\Delta Comp2=(C3/(C3+C4+C8+Cd))\Delta EVDD$$

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A power-supply voltage detection circuit for detecting that at least one of an external power-supply voltage and an internal power-supply voltage generated from the external power-supply voltage goes out of a predetermined regulation, the circuit comprising:
   a first comparator comparing a first output voltage with a reference voltage, said first output voltage generated based on the internal power-supply voltage, for detecting the internal power-supply voltage being equal to or less than a first predetermined value;
   a second comparator comparing a second output voltage with a reference voltage, said second output voltage generated based on the internal power-supply voltage, for detecting the internal power-supply voltage being greater than a second predetermined value;
   a first capacitor for AC-coupling a first input terminal of the first comparator to the external power-supply voltage;
   a second capacitor for AC-coupling a first input terminal of the second comparator to the external power-supply voltage;
   a third capacitor for AC-coupling a second input terminal of the first comparator to the internal power-supply voltage; and
   a fourth capacitor for AC-coupling a second input terminal of the second comparator to the internal power-supply voltage,
   wherein an output of the first comparator and an output of the second comparator each provides a signal that indicates that the predetermined regulation has been exceeded.

2. The power-supply voltage detection circuit of claim 1, further comprising:
   a fifth capacitor for AC-coupling one input terminal of the first comparator to a ground; and
   a sixth capacitor for AC-coupling one input terminal of the second comparator to the ground.

3. An integrated circuit device, comprising:
   a power-supply voltare detection circuit of claim 1;
   a reference voltage generator circuit for generating a third predetermined reference voltage; and
   a regulator circuit for generating the internal power-supply voltage to be supplied to an internal circuit from an external power-supply voltage by using the third predetermined reference voltage.

4. A power-supply voltage detection circuit for detecting an anomaly of a power-supply voltage, the circuit comprising:
   a regulator circuit for generating a second power-supply voltage front a first power supply voltage;
   a first comparator for detecting the second power-supply voltage being equal to or less than a predetermined value, the first comparator havina a first input terminal receiving a first output voltage generated based on the second power-supply voltage and a second input terminal receiving a reference voltage;
   a first capacitor for AC-coupling the first input terminal or the second input terminal of the comparator to the first power-supply voltage;
   a second comparator for detecting the second power-supply voltage being greater than a predetermined value, the second comparator having a fifth input terminal receiving a third output voltage generated based on the second power-supply voltage and a sixth input terminal receiving the reference voltage;
   a second capacitor for AC-coupling of the fifth input terminal or the sixth input terminal of the comparator to the first power-supply voltage;
   a third capacitor for AC-coupling one input terminal of the first comparator to the second power-supply voltage; and
   a fourth capacitor for AC-coupling one input terminal of the second comparator to the second power-supply voltage.

5. A power-supply voltage detection circuit for detecting an anomaly of a power-supply voltage, the circuit comprising:
   a regulator circuit for generating a second power-supply voltage from a first power supply voltage;
   a first comparator for detecting the second power-supply voltage being equal to or less than a predetermined value, the first comparator having a first input terminal receiving a first output voltage generated based on the second power-supply voltage and a second input terminal receiving a reference voltage;
   a first capacitor for AC-coupling the first input terminal or the second input terminal of the comparator to the first power-supply voltage;

a second comparator for detecting the second power-supply voltage being greater than a predetermined value, the second comparator having a fifth input terminal receiving a third output voltage generated based on the second power-supply voltage and a sixth input terminal receiving the reference voltage;

a second capacitor for AC-coupling of the fifth input terminal or the sixth input terminal of the comparator to the first power-supply voltage;

a third capacitor for AC-coupling one input terminal of the first comparator to a ground; and a fourth capacitor for AC-coupling one input terminal of the second comparator to the ground.

6. The power-supply voltage detection circuit of claim 4, further comprising:

a fifth capacitor for AC-coupling one input terminal of the first comparator to a ground; and a sixth capacitor for AC-coupling one input terminal of the second comparator to the ground.

7. The power-supply voltage detection circuit of claim 4, wherein the first output voltage and the third output voltage are generated from the second power-supply voltage by dividing the second power-supply voltage via a resistor, and the first output voltage and the third output voltage are different from each other.

8. The power-supply voltage detection circuit of claim 5, wherein the first output voltage and the third output voltage are generated from the second power-supply voltage by dividing the second power-supply voltage via a resistor, and the first output voltage and the third output voltage are different from each other.

* * * * *